(12) United States Patent
Katayama et al.

(10) Patent No.: US 10,770,486 B2
(45) Date of Patent: Sep. 8, 2020

(54) METHOD OF PRODUCING LIQUID CRYSTAL CELL, AND LIQUID CRYSTAL CELL

(71) Applicant: Sharp Kabushiki Kaisha, Saiki, Osaka (JP)

(72) Inventors: Takashi Katayama, Sakai (JP); Isamu Miyake, Sakai (JP); Akira Hirai, Sakai (JP); Kei Shinada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/339,415

(22) PCT Filed: Oct. 2, 2017

(86) PCT No.: PCT/JP2017/035805
§ 371 (c)(1),
(2) Date: Apr. 4, 2019

(87) PCT Pub. No.: WO2018/066503
PCT Pub. Date: Apr. 12, 2018

(65) Prior Publication Data
US 2020/0043957 A1 Feb. 6, 2020

(30) Foreign Application Priority Data
Oct. 6, 2016 (JP) .................. 2016-198022

(51) Int. Cl.
*H01L 27/12* (2006.01)
*H01L 21/285* (2006.01)
(Continued)

(52) U.S. Cl.
CPC .......... *H01L 27/1255* (2013.01); *C09K 19/56* (2013.01); *H01L 21/28556* (2013.01);
(Continued)

(58) Field of Classification Search
CPC .......... H01L 27/1255; H01L 21/28556; H01L 23/66; G02F 1/133711; G02F 1/133788
See application file for complete search history.

(56) References Cited

U.S. PATENT DOCUMENTS

2007/0273599 A1  11/2007  Haziza
2008/0036664 A1   2/2008  Haziza
(Continued)

FOREIGN PATENT DOCUMENTS

| JP | 2009-538565 A | 11/2009 |
| JP | 2013-539949 A | 10/2013 |
| JP | 2016-512408 A |  4/2016 |

*Primary Examiner* — Christine A Enad
(74) *Attorney, Agent, or Firm* — Keating & Bennett, LLP

(57) ABSTRACT

A method of producing a liquid crystal cell includes: a thin-film forming step of forming, on a surface of one electrode-attached substrates including a TFT substrate and a slot substrate, the TFT substrate including a first dielectric substrate, TFTs, and patch electrodes electrically connected to the TFTs, the slot substrate including a second dielectric substrate and a slot electrode supported on the second dielectric substrate and having slots, a thin film so as to cover the patch electrodes and/or the slot electrode; and a light irradiating step of irradiating the thin film with light including p-polarized light to provide the thin film with alignment-regulating capability of aligning liquid crystal molecules to thereby obtain an alignment film. The thin film includes a polymer including a photoreactive functional group and exhibiting the alignment-regulating capability of the thin film in a direction orthogonal to a polarization axis of the p-polarized light.

10 Claims, 11 Drawing Sheets

(51) Int. Cl.
*H01L 23/66* (2006.01)
*G02F 1/1337* (2006.01)
*C09K 19/56* (2006.01)
*H01Q 3/34* (2006.01)

(52) U.S. Cl.
CPC ............ H01L 23/66 (2013.01); H01Q 3/34 (2013.01); *H01L 2223/6677* (2013.01)

(56) References Cited

U.S. PATENT DOCUMENTS

| | | |
|---|---|---|
| 2008/0048922 A1 | 2/2008 | Haziza |
| 2008/0111755 A1 | 5/2008 | Haziza |
| 2008/0117113 A1 | 5/2008 | Haziza |
| 2008/0117114 A1 | 5/2008 | Haziza |
| 2008/0316142 A1 | 12/2008 | Haziza |
| 2009/0058747 A1 | 3/2009 | Haziza |
| 2009/0091500 A1 | 4/2009 | Haziza |
| 2010/0157223 A1* | 6/2010 | Shin ................. G02F 1/133788 349/129 |
| 2012/0104404 A1* | 5/2012 | Kwack .............. G02F 1/134363 257/72 |
| 2012/0194399 A1 | 8/2012 | Bily et al. |
| 2014/0218667 A1* | 8/2014 | Miyachi ........... G02F 1/133711 349/99 |
| 2014/0266946 A1 | 9/2014 | Bily et al. |
| 2015/0015826 A1* | 1/2015 | Mizusaki ............... C09K 19/56 349/61 |
| 2015/0229028 A1 | 8/2015 | Bily et al. |
| 2016/0359234 A1 | 12/2016 | Bily et al. |
| 2016/0372834 A1 | 12/2016 | Bily et al. |

* cited by examiner

METHOD OF PRODUCING LIQUID CRYSTAL CELL, AND LIQUID CRYSTAL CELL

TECHNICAL FIELD

The present invention relates to a method of producing a liquid crystal cell, and a liquid crystal cell.

BACKGROUND ART

Antennas used for mobile communications, satellite broadcasting and the like require a beam scanning function for enabling a beam direction change. As an antenna having such function, a scanned antenna that utilizes the large dielectric anisotropy (birefringence index) of a liquid crystal material (including nematic liquid crystals and polymer-dispersed liquid crystals) has been proposed (e.g., see Patent Documents 1 to 3). This type of scanned antenna is provided with a liquid crystal cell which includes a liquid crystal layer sandwiched between a pair of electrode-attached substrates.

The substrates are each formed with an alignment film covering electrodes on a surface on the side contacting the liquid crystal layer. The alignment film is made of a polymer material. During the production process for the liquid crystal cell, before the substrates are affixed to each other, the alignment film is subjected to a predetermined alignment treatment to exhibit a function for aligning the liquid crystal molecules in the liquid crystal layer in a predetermined direction.

When an alignment treatment (so-called photo-alignment treatment) is performed in which an alignment film is irradiated with light (for example, polarized ultraviolet light), a photoreactive polymer material is used in the alignment film. By irradiating the alignment film with light from the air interface side (front side), the polymer material is subjected to photoreaction.

RELATED ART DOCUMENT

Patent Document

Patent Document 1: Japanese Translation of PCT International Application Publication No. JP-T-2013-539949

Patent Document 2: Japanese Translation of PCT International Application Publication No. JP-T-2016-512408

Patent Document 3: Japanese Translation of PCT International Application Publication No. JP-T-2009-538565

PROBLEM TO BE SOLVED BY THE INVENTION

In a liquid crystal cell for a scanned antenna, as the material constituting the electrodes, metal materials such as copper (Cu) and aluminum (Al) are used. This means that the electrodes made of material that easily reflect light are disposed on the lower side of the alignment film.

When the photo-alignment treatment is implemented with respect to such alignment film during the liquid crystal cell production process, the polymer material in the alignment film is subjected to photoreaction not only due to the light supplied from the front side but also due to light reflected by the electrodes and then supplied from the back side. As a result, the alignment function provided by the light from the front side may be reduced by the influence of photoreaction due to the reflected light, and may even be completely cancelled out.

DISCLOSURE OF THE PRESENT INVENTION

An object of the present invention is to provide a method of producing a liquid crystal cell by which an alignment film can be provided with an alignment-regulating capability without being subjected to the influence of reflected light during photo-alignment treatment, and to provide a liquid crystal cell.

MEANS FOR SOLVING THE PROBLEM

A method of producing a liquid crystal cell according to the present invention, the method includes: a thin-film forming step of forming, on a surface of at least one electrode-attached substrate of a pair of electrode-attached substrates including a TFT substrate and a slot substrate, the TFT substrate including a first dielectric substrate, TFTs supported on the first dielectric substrate, and patch electrodes electrically connected to the TFTs, the slot substrate including a second dielectric substrate and a slot electrode supported on the second dielectric substrate and having slots, a thin film so as to cover the patch electrodes and/or the slot electrode; and a light irradiating step of irradiating the thin film with light including p-polarized light to provide the thin film with alignment-regulating capability of aligning liquid crystal molecules to thereby obtain an alignment film. The thin film includes a polymer including a photoreactive functional group and exhibiting the alignment-regulating capability of the thin film in a direction orthogonal to a polarization axis of the p-polarized light.

Preferably, in the method of producing a liquid crystal cell, the thin film may exhibit the alignment-regulating capability due to isomerization of the photoreactive functional group of the polymer.

Preferably, in the method of producing a liquid crystal cell, the thin film may exhibit the alignment-regulating capability due to dimerization of the photoreactive functional group of the polymer after isomerization.

Preferably, in the method of producing a liquid crystal cell, the thin film may exhibit the alignment-regulating capability due to photocleavage of the photoreactive functional group of the polymer.

Preferably, in the method of producing a liquid crystal cell, the thin film may include a cinnamate group as the photoreactive functional group of the polymer.

Preferably, in the method of producing a liquid crystal cell, the thin film may include an azobenzene group as the photoreactive functional group of the polymer.

Preferably, in the method of producing a liquid crystal cell, the thin film may include a cyclobutane diimide structure as the photoreactive functional group of the polymer.

Preferably, in the method of producing a liquid crystal cell, the patch electrodes and the slot electrode may be made of a metal or an alloy.

A liquid crystal cell according to the present invention includes: a pair of the TFT substrate and the slot substrate having on at least one surface thereof the alignment film obtained by the method of producing a liquid crystal cell according to any one of the above; and a liquid crystal layer interposed between the TFT substrate and the slot substrate which are disposed with the patch electrode side and the slot electrode side opposing each other in such a way that the slots are arranged in correspondence to the patch electrodes.

Preferably, in the liquid crystal cell, the liquid crystal layer may include liquid crystal molecules that contain an isothiocyanate group.

ADVANTAGEOUS EFFECT OF THE INVENTION

According to the present invention, a method of producing a liquid crystal cell by which an alignment film can be provided with alignment-regulating capability without being subjected to the influence of reflected light during photo-alignment treatment, and a liquid crystal cell can be provided.

MODES FOR CARRYING OUT THE INVENTION

First embodiment (Basic Structure of Scanned Antenna)

A scanned antenna is provided with a beam scanning function for enabling a change in beam direction, and has a structure provided with antenna units utilizing the anisotropy (dielectric constant anisotropy) of the large dielectric constant M ($\varepsilon$M) of a liquid crystal material. The scanned antenna, by controlling the voltage applied to a liquid crystal layer of each antenna unit, and by varying the effective dielectric constant M ($\varepsilon$M) of the liquid crystal layer in the electric field direction of each antenna unit, forms a two-dimensional pattern using the antenna units having different capacitances. The dielectric constant of liquid crystal material has a frequency dispersion. Accordingly, in the present description, the dielectric constant in a microwave frequency band is specifically denoted by "dielectric constant M ($\varepsilon$M)".

Electromagnetic waves (for example, microwaves) emitted from, or received by, the scanned antenna are provided with a phase difference in accordance with the capacitance of each antenna unit, and come to have a strong directivity (beam scan) in a specific direction in accordance with the two-dimensional pattern formed by the antenna units having different capacitances. For example, spherical waves obtained as the result of input electromagnetic waves having entered the respective antenna units and been scattered by the antenna units are integrated in consideration of the phase difference given by each of the antenna units, whereby the electromagnetic waves emitted from the scanned antenna are obtained.

Figure 1:
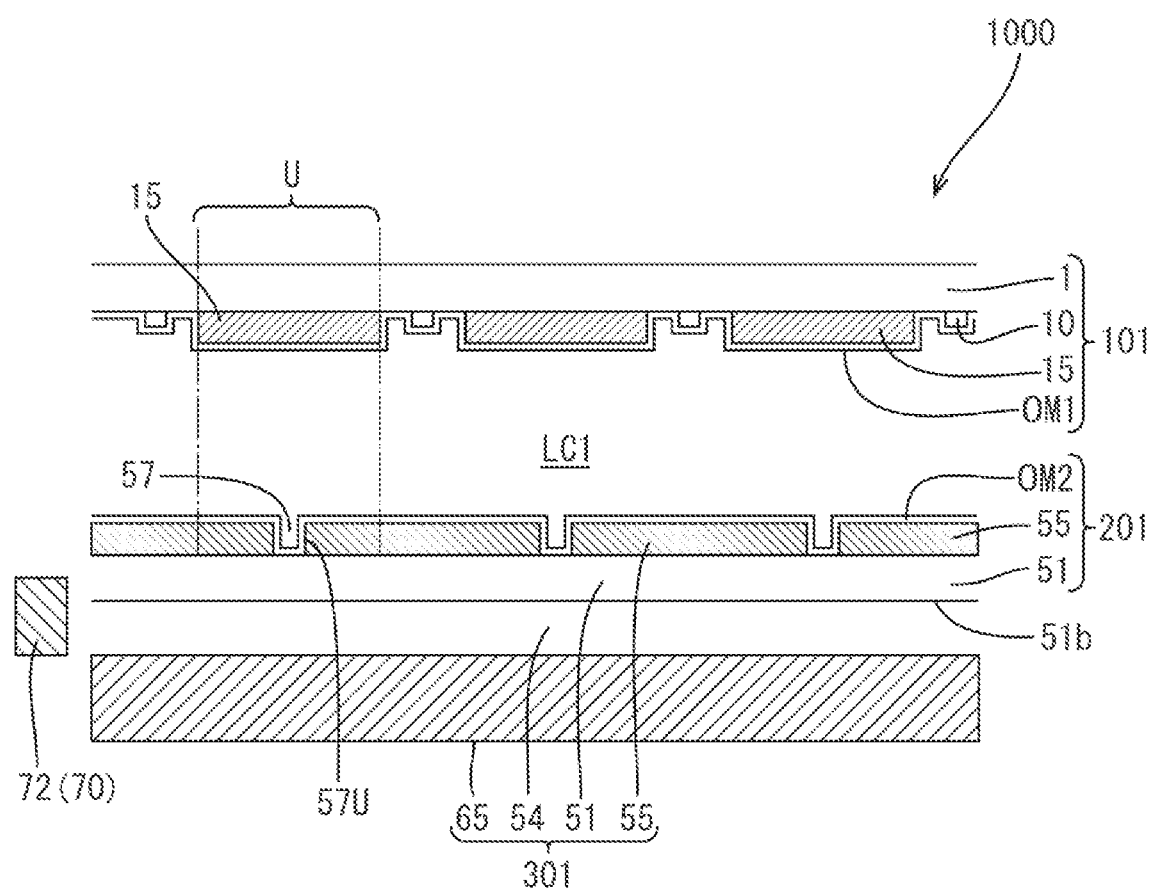
FIG. 1 is a cross sectional view schematically depicting a part of a scanned antenna according to a first embodiment.

A basic structure of the scanned antenna according to an embodiment of the present invention will be described with reference to FIG. 1, for example. FIG. 1 is a cross sectional view schematically depicting a part of a scanned antenna 1000 according to the first embodiment. The scanned antenna 1000 of the present embodiment is a radial inline slot antenna in which slots 57 are concentrically arranged. FIG. 1 schematically depicts a part of a cross section taken in a radius direction from a feeder pin 72 disposed in the vicinity of the center of the concentrically arranged slots. In other embodiments, the slots maybe arranged in various known ways (for example, a spiral shape and a matrix shape).

The scanned antenna 1000 is mainly provided with a TFT substrate 101, a slot substrate 201, a liquid crystal layer LC disposed therebetween, and a reflecting conductive plate 65. The scanned antenna 1000 is configured to transmit and receive microwaves from the TFT substrate 101 side. The TFT substrate 101 and the slot substrate 201 are disposed so as to oppose each other with the liquid crystal layer LC sandwiched therebetween.

The TFT substrate 101 is provided with: a dielectric substrate (an example of a first dielectric substrate) 1, such as a glass substrate; patch electrodes 15 and thin film transistors (TFTs) 10 which are formed on the liquid crystal layer LC side of the dielectric substrate 1; and an alignment film OM1 formed on an outermost surface on the liquid crystal layer LC side. The TFTs 10 are connected to a gate bus line and a source bus line, which are not illustrated in FIG. 1.

The slot substrate 201 is provided with: a dielectric substrate (an example of a second dielectric substrate) 51, such as a glass substrate; a slot electrode 55 formed on the liquid crystal layer LC side of the dielectric substrate 51; and an alignment film OM2 formed on an outermost surface on the liquid crystal layer LC side. The slot electrode 55 is provided with slots 57.

Preferably, the dielectric substrates 1, 51 used for the TFT substrate 101 and the slot substrate 201 have a small dielectric loss with respect to microwaves, and may employ plastic substrates, besides glass substrates. The thickness of the dielectric substrates 1, 51 is not particularly limited. For example, the thickness is preferably not more than 400 μm and more preferably not more than 300 μm. The dielectric substrates 1, 51 do not have any specific lower limit to the thickness thereof, and are only required to have a strength to withstand the production process and the like.

The reflecting conductive plate 65 is disposed so as to oppose the slot substrate 201 with an air layer 54 therebetween. In other embodiments, instead of the air layer 54, a layer formed of a dielectric material (for example, a fluorine resin such as PTFE) having a small dielectric constant M with respect to microwaves may be used. In the scanned antenna 1000 of the present embodiment, the slot electrode 55, the reflecting conductive plate 65, and the dielectric substrate 51 and the air layer 54 therebetween function as a waveguide 301.

The patch electrodes 15, a portion of the slot electrode 55 that includes the slot 57 (which may be hereafter referred to as a "slot electrode unit 57U"), and the liquid crystal layer LC therebetween configure an antenna unit U. In each antenna unit U, a single island-like patch electrode 15 and a single hole-like slot 57 (slot electrode unit 57U) are opposed to each other with the liquid crystal layer LC therebetween, forming a liquid crystal capacitance. In the scanned antenna 1000 of the present embodiment, the antenna units U are concentrically arranged. The antenna units U are provided with an auxiliary capacitance electrically connected in parallel to the liquid crystal capacitance.

The slot electrode 55 functions as a wall of the waveguide 301, in addition to configuring the antenna unit U in each slot electrode unit 57U. Thus, the slot electrode 55 requires a function for suppressing the transmission of microwaves, and is therefore configured from a relatively thick metal layer. Examples of the metal layer include a Cu layer and an Al layer. For example, in order to reduce microwaves of 10 GHz to 1/150, the thickness of the Cu layer is set to not less than 3.3 µm, and the thickness of the Al layer is set to not less than 4.0 µm. In order to reduce microwaves of 30 GHz to 1/150, the thickness of the Cu layer is set to not less than 1.9 µm, and the thickness of the Al layer is set to not less than 2.3 µm. The upper limit of the thickness of the metal layer configuring the slot electrode 55 is not particularly limited; however, considering the formation of the alignment film OM2 as will be described later, it may be said that the thinner, the better. Using a Cu layer as the metal layer provides the advantage of being able to be thinner than the Al layer. The slot electrode 55 may be formed by the thin-film deposition method used for conventional liquid crystal display device technology, or by other methods, such as affixing a metal foil (for example, a Cu foil or an Al foil) onto the substrate. The thickness of the metal layer is set to, for example, from 2 µm to 30 µm inclusive. When the metal layer is formed using the thin-film deposition method, the thickness of the metal layer is set to, for example, not more than 5 µm. The reflecting conductive plate 65 may include an aluminum plate, a copper plate and the like having a thickness of, for example, the order of several millimeters.

The patch electrodes 15 do not configure the waveguide 301, as does the slot electrode 55. Thus, the patch electrodes 15 are configured from a metal layer having a thickness smaller than that of the slot electrode 55. In order to prevent the loss of heat conversion that occurs when the oscillation of free electrons in the vicinity of the slots 57 of the slot electrode 55 induce the oscillation of free electrons in the patch electrodes 15, a smaller resistance is preferable. From the viewpoint of mass producibility and the like, it is preferable to use an Al layer rather than a Cu layer, where the thickness of the Al layer is preferably not less than 0.5 µm and not more than 2 µm, for example.

The antenna units U have an arrange pitch which is set to not more than λ/4 and/or not more than λ/5, for example, where λ is the wavelength of the microwaves as described in Patent Document 1. The wavelength λ is 25 mm, for example, in which case the arrange pitch is set to not more than 6.25 mm and/or not more than 5 mm, for example.

In the scanned antenna 1000, the capacitance value of the liquid crystal capacitance of the antenna units U are varied in order to vary the phase of microwaves excited (reradiated) from each of the patch electrodes 15. Accordingly, the liquid crystal layer LC preferably has a large anisotropy ($\Delta\varepsilon M$) of the dielectric constant M ($\varepsilon M$) with respect to microwaves, and a small $\tan\delta M$ (dielectric loss tangent with respect to microwaves). For example, the material having $\Delta\varepsilon M$ of not less than 4 and $\tan\delta M$ of not more than 0.02 (both of which are values at 19 GHz) described by M. Wittek et al., in SID 2015 DIGEST, pp.824-826, may be preferably used. It is also possible to use the liquid crystal material having $\Delta\varepsilon M$ of not less than 0.4 and $\tan\delta M$ of not more than 0.04 described by Kuki in Polymers, Vol. 55, August, pp.599-602 (2006).

While the dielectric constant of liquid crystal material generally has a frequency dispersion, the dielectric anisotropy $\Delta\varepsilon M$ with respect to microwaves is positively correlated with the refractive index anisotropy $\Delta n$ with respect to visible light. Accordingly, it may be said that as the liquid crystal material for an antenna unit with respect to microwaves, it is preferable to use a material having a large refractive index anisotropy $\Delta n$ with respect to visible light. In this case, when $\Delta n$ (birefringence) with respect to light of 550 nm is used as an index, a nematic liquid crystal having $\Delta n$ of not less than 0.3 and preferably not less than 0.4 is used for an antenna unit with respect to microwaves. The upper limit of $\Delta n$ is not particularly limited. The thickness of the liquid crystal layer LC is set to from 1 µm to 500 µm inclusive, for example.

Figure 2:
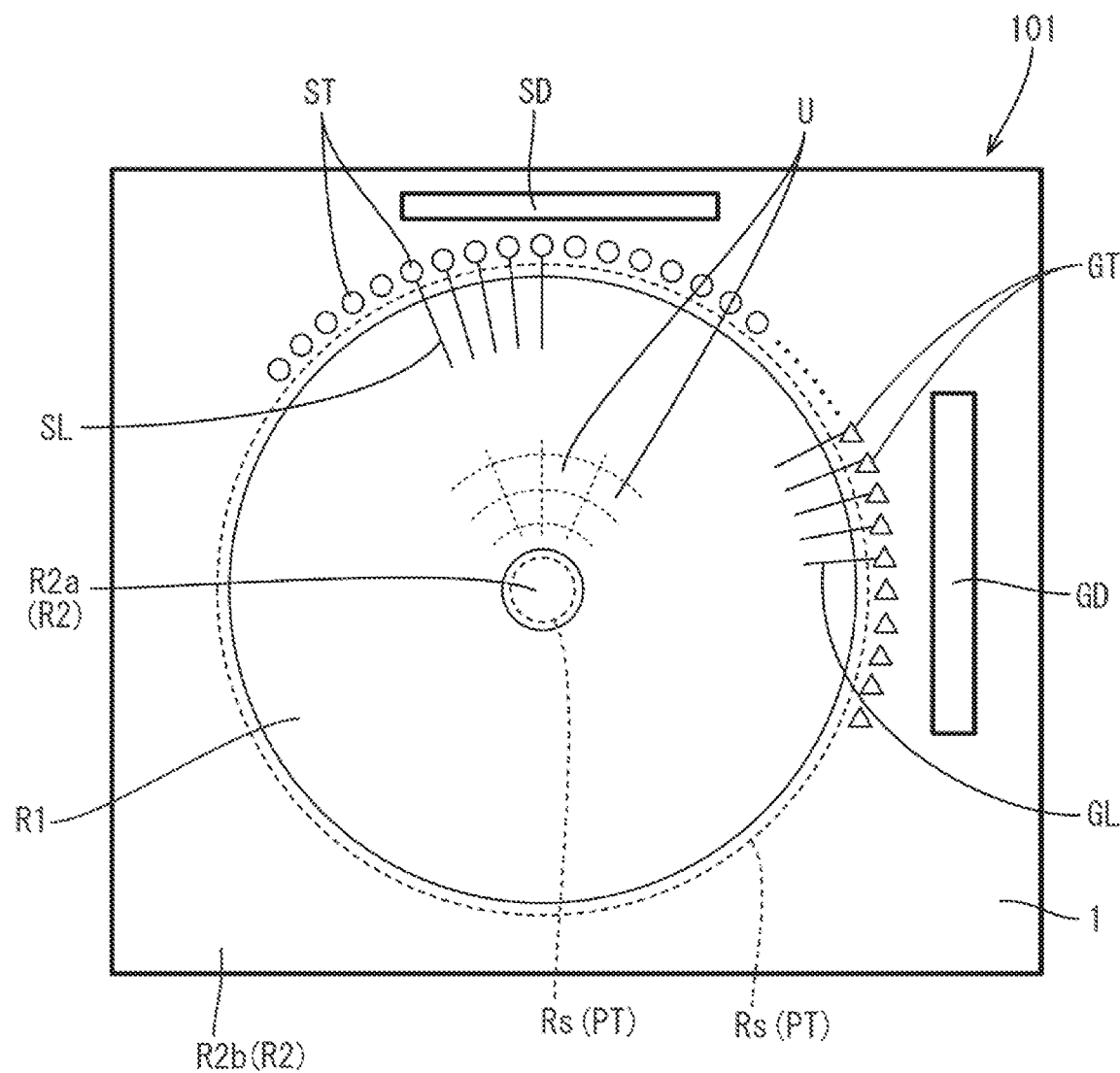
FIG. 2 is a plan view schematically depicting a TFT substrate with which the scanned antenna is provided.
Figure 3:
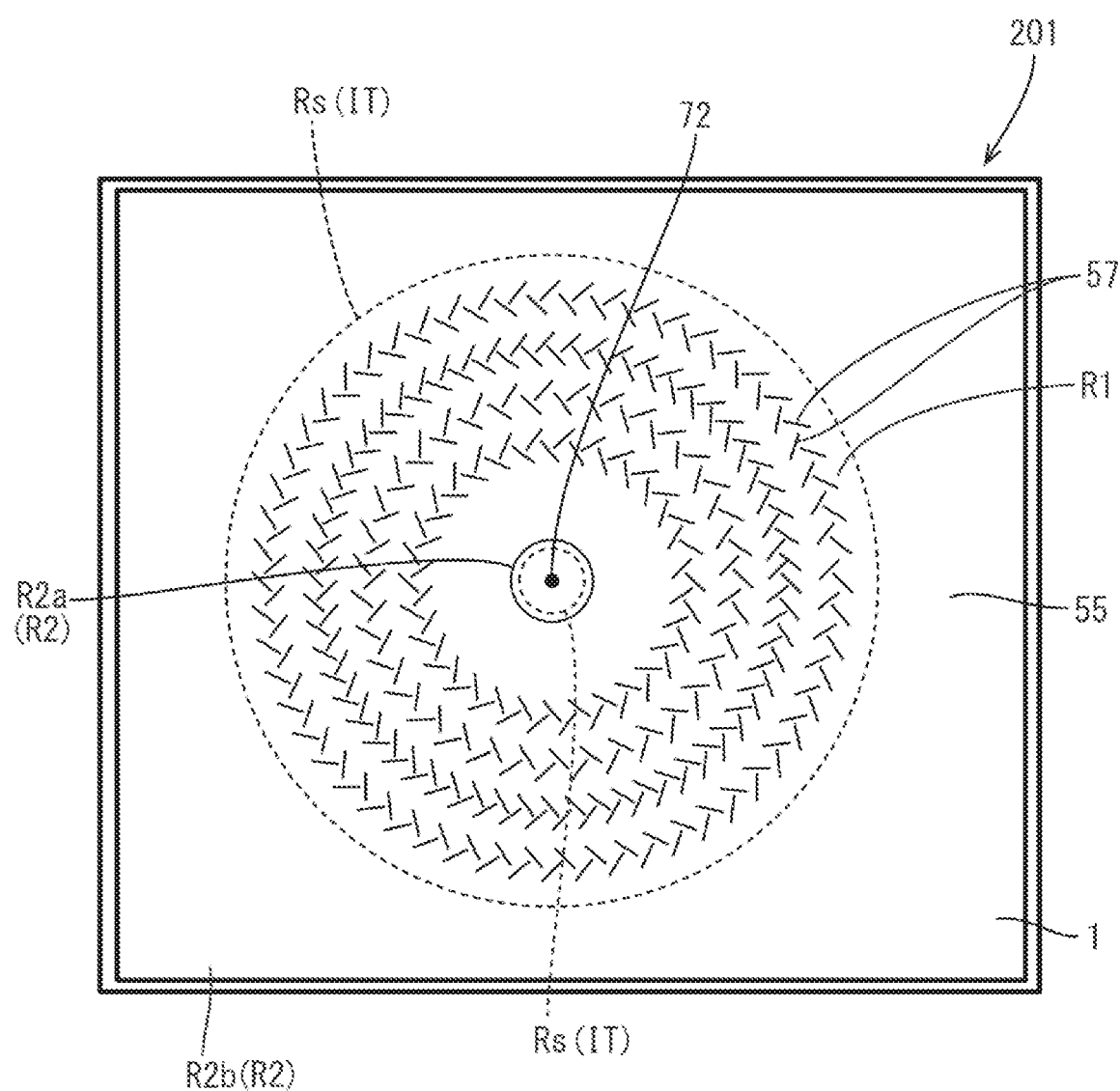
FIG. 3 is a plan view schematically depicting a slot substrate with which the scanned antenna is provided.

FIG. 2 is a plan view schematically depicting the TFT substrate 101 with which the scanned antenna 1000 is provided. FIG. 3 is a plan view schematically depicting the slot substrate 201 with which the scanned antenna 1000 is provided. The regions of the TFT substrate 101 and the regions of the slot substrate 201 which correspond to the antenna units U will be both referred to as "antenna unit regions" for convenience of description, using the same reference symbols as those for the antenna units. As depicted in FIG. 2 and FIG. 3, in the TFT substrate 101 and the slot substrate 201, a region defined by two-dimensionally arranged antenna unit regions U is referred to as a "transmitting/receiving region R1", and regions other than the transmitting/receiving region R1 are referred to as a "non-transmitting/receiving region R2". In the non-transmitting/receiving region R2, terminal portions, a drive circuit and the like are disposed.

The transmitting/receiving region R1, when viewed in plan, has a circular ring shape. The non-transmitting/receiving region R2 includes a first non-transmitting/receiving region R2a positioned at the center of the transmitting/receiving region R1, and a second non-transmitting/receiving region R2b disposed at the periphery of the transmitting/receiving region R1. The outer diameter of the transmitting/receiving region R1 is, for example, from 200 mm to 1,500 mm inclusive, and is set as appropriate in accordance with the amount of communication and the like.

In the transmitting/receiving region R1 of the TFT substrate 101, gate bus lines GL and source bus lines SL which are supported on the dielectric substrate 1 are provided. These wires are utilized to control the driving of the antenna unit regions U. Each of the antenna unit regions U includes a TFT 10 and a patch electrode 15 electrically connected to the TFT 10. The source electrode of the TFTs 10 is electrically connected to the source bus lines SL, and the gate electrode thereof is electrically connected to the gate bus lines GL. The drain electrode of the TFTs 10 is electrically connected to the patch electrodes 15.

In the non-transmitting/receiving region R2 (the first non-transmitting/receiving region R2a and the second non-transmitting/receiving region R2b), a sealing region Rs in which sealing material (not illustrated) is formed is disposed so as to surround the transmitting/receiving region R1. The sealing material has the function of, e.g., adhering the TFT substrate 101 and the slot substrate 201 to each other, and sealing the liquid crystal material (liquid crystal layer LC) between the substrates 101, 201.

In the non-transmitting/receiving region R2, gate terminal portions GT, a gate driver GD, source terminal portions ST, and a source driver SD are disposed on the outside of the sealing region Rs. Each of the gate bus lines GL is connected to the gate driver GD via the gate terminal portions GT. Each of the source bus lines SL is connected to the source driver SD via the source terminal portions ST. In the present embodiment, both the source driver SD and the gate driver GD are formed on the dielectric substrate 1 of the TFT substrate 101. However, one or both of the drivers may be formed on the dielectric substrate 51 of the slot substrate 201.

In the non-transmitting/receiving region R2, transfer terminal portions PT are provided. The transfer terminal portions PT are electrically connected to the slot electrode 55 of the slot substrate 201. In the present embodiment, the transfer terminal portions PT are disposed in both the first non-transmitting/receiving region R2a and the second non-transmitting/receiving region R2b. In other embodiments, the transfer terminal portions PT may be disposed in only one of the regions. In the present embodiment, the transfer terminal portions PT are disposed within the sealing region Rs. Accordingly, as the sealing material, an electrically conductive resin that contains electrically conductive particles (electrically conductive beads) is used.

As depicted in FIG. 3, in the slot substrate 201, the slot electrode 55 is formed on the dielectric substrate 51 across the transmitting/receiving region R1 and the non-transmitting/receiving region R2. In FIG. 3, the surface of the slot substrate 201 as viewed from the liquid crystal layer LC side is depicted, and the alignment film OM2 formed on the outermost surface is omitted for convenience of description.

In the transmitting/receiving region R1 of the slot substrate 201, the slot electrode 55 is provided with the slots 57. The slots 57 are each individually allocated to each of the antenna unit regions U of the TFT substrate 101. In the present embodiment, pairs of the slots 57 are concentrically disposed so as to configure a radial inline slot antenna, each pair of the slots 57 extending in generally orthogonal directions to each other. Such pairs of slots 57 make it possible for the scanned antenna 1000 to transmit and receive circularly polarized waves.

In the non-transmitting/receiving region R2 of the slot substrate 201, terminal portions IT of the slot electrode 55 are provided. The terminal portions IT are electrically connected to the transfer terminal portions PT of the TFT substrate 101. In the present embodiment, the terminal portions IT are disposed within the sealing region Rs, and are electrically connected to the corresponding transfer terminal portions PT by the sealing material which, as described above, is made of an electrically conductive resin including electrically conductive particles (electrically conductive beads).

In the first non-transmitting/receiving region R2a, a feeder pin 72 is disposed at the center of the concentric circles formed by the slots 57. The feeder pin 72 is used to supply microwaves to the waveguide 301 configured from the slot electrode 55, the reflecting conductive plate 65, and the dielectric substrate 51. The feeder pin 72 is connected to a feed device 70. As a feeding system, either a direct-connected feeding system or an electromagnetically coupled system may be used, and a known feeding structure may be adopted.

In the following, the TFT substrate 101, the slot substrate 201, and the waveguide 301 will be described in detail.

(Structure of TFT Substrate 101)

Figure 4:
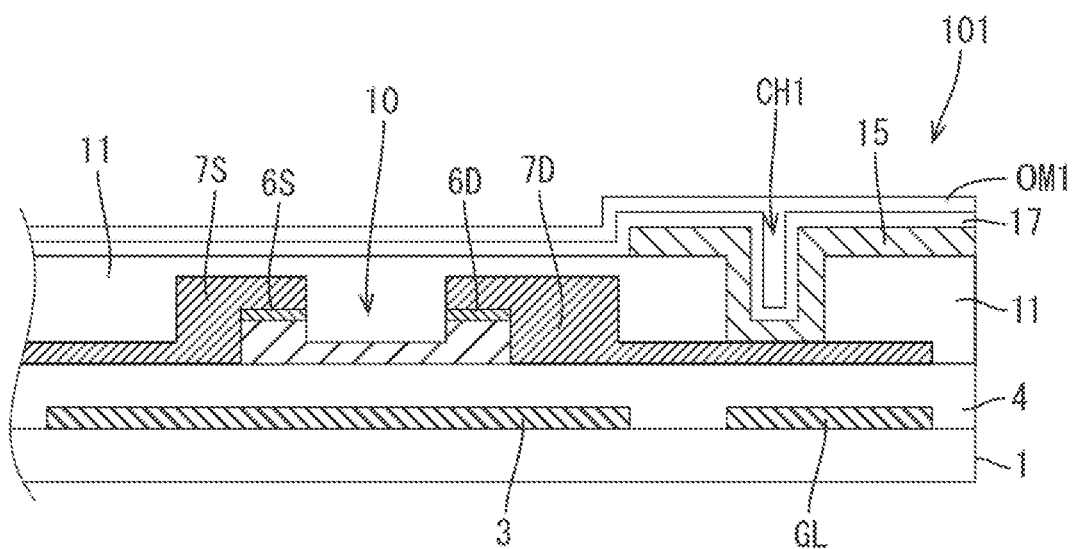
FIG. 4 is a cross sectional view schematically depicting an antenna unit region of the TFT substrate.
Figure 5:
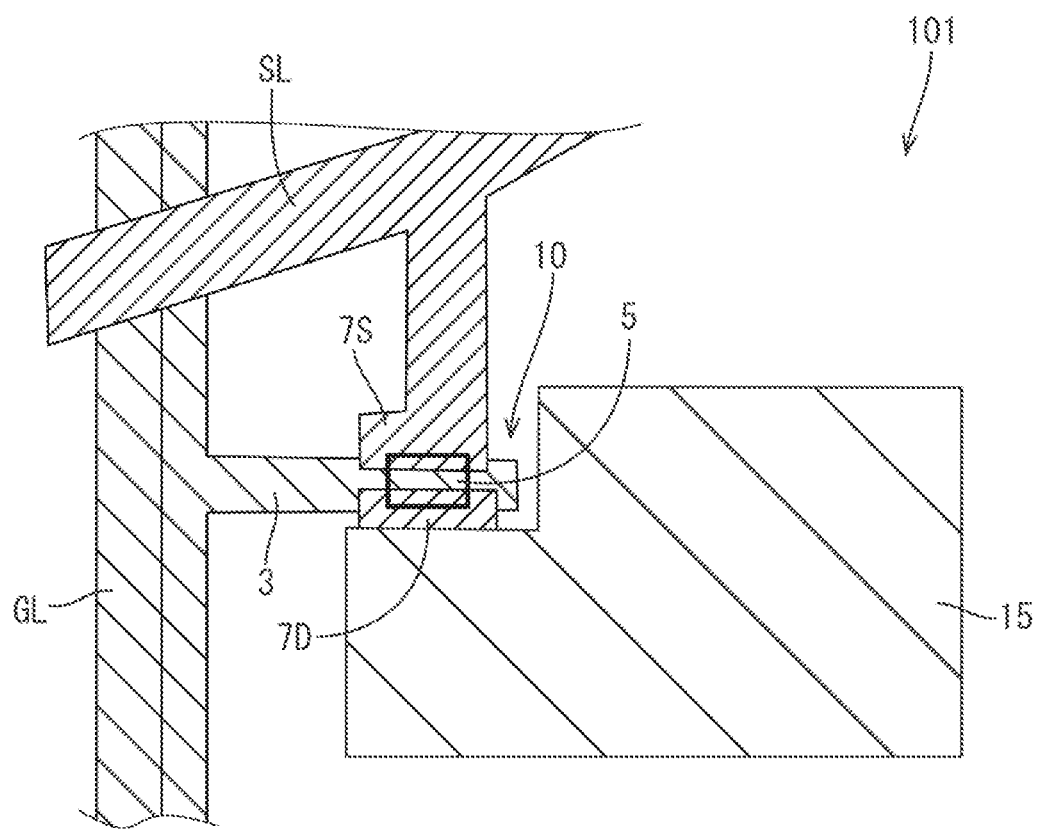
FIG. 5 is a plan view schematically depicting the antenna unit region of the TFT substrate.

FIG. 4 is a cross sectional view schematically depicting the antenna unit region U of the TFT substrate 101. FIG. 5 is a plan view schematically depicting the antenna unit region U of the TFT substrate 101. In each of FIG. 4 and FIG. 5, the cross-sectional configuration of a part of the transmitting/receiving region R1 is depicted.

Each antenna unit region U of the TFT substrate 101 is provided with: the dielectric substrate (first dielectric substrate) 1; the TFT 10 supported on the dielectric substrate 1; a first insulating layer 11 covering the TFT 10; the patch electrode 15 formed on the first insulating layer 11 and electrically connected to the TFT 10; a second insulating layer 17 covering the patch electrode 15; and the alignment film OM1 covering the second insulating layer 17.

The TFT 10 is provided with: a gate electrode 3; an island-like semiconductor layer 5; a gate insulating layer 4 disposed between the gate electrode 3 and the semiconductor layer 5; a source electrode 7S; and a drain electrode 7D. In the present embodiment, the TFT 10 is of a channel-etched type having a bottom gate structure. In other embodiments, the TFT may have other structures.

The gate electrode 3 is electrically connected to the gate bus line GL, and is supplied with a scan signal via the gate bus line GL. The source electrode 7S is electrically connected to the source bus line SL, and is supplied with a data signal via the source bus line SL. The gate electrode 3 and the gate bus line GL may be formed from the same conductive film (gate conductive film). The source electrode 7S, the drain electrode 7D, and the source bus line SL may be formed from the same conductive film (source conductive film). The gate conductive film and the source conductive film are made of metal films, for example. A layer formed using the gate conductive film may be hereafter referred to as a "gate metal layer". A layer formed using the source conductive film may be hereafter referred to as a "source metal layer".

The semiconductor layer 5 is disposed so as to overlap the gate electrode 3 with the gate insulating layer 4 therebetween. As depicted in FIG. 4, on the semiconductor layer 5, a source contact layer 6S and a drain contact layer 6D are formed. The source contact layer 6S and the drain contact layer 6D are disposed so as to oppose each other on both sides of a region (channel region) of the semiconductor layer 5 in which the channel is formed. In the present embodiment, the semiconductor layer 5 is made of an intrinsic amorphous silicon (i-a-Si) layer, and the source contact layer 6S and the drain contact layer 6D are made of an n+-type amorphous silicon (n$^+$-a-Si) layer. In other embodiments, the semiconductor layer 5 may be configured from a polysilicon layer, an oxide semiconductor layer, or the like.

The source electrode 7S is disposed in contact with the source contact layer 6S, and is connected to the semiconductor layer 5 with the source contact layer 6S therebetween. The drain electrode 7D is disposed in contact with the drain contact layer 6D, and is connected to the semiconductor layer 5 with the drain contact layer 6D therebetween.

The first insulating layer 11 is provided with a contact hole CH1 reaching the drain electrode 7D of the TFT 10.

The patch electrode 15 is provided on the first insulating layer 11 and in the contact hole CH1, and is in contact with the drain electrode 7D in the contact hole CH1. The patch electrode 15 is mainly configured from a metal layer. The patch electrode 15 may be a metal electrode formed only from a metal layer. The material of the patch electrode 15 may be the same as that of the source electrode 7S and the drain electrode 7D. The thickness of the metal layer of the patch electrode 15 (or the thickness of the patch electrode 15 when the patch electrode 15 is a metal electrode) maybe the same as, or, preferably, greater than, the thickness of the source electrode 7S and the drain electrode 7D. When the thickness of the patch electrode 15 is large, it is possible to reduce the transmittance with respect to electromagnetic waves and decrease the sheet resistance of the patch electrode, thereby decreasing the loss of conversion of the oscillation of free electrons in the patch electrode into heat.

A CS bus line CL may be provided using the same conductive film as that of the gate bus line GL. The CS bus line CL may be arranged to overlap the drain electrode 7D (or an extension of the drain electrode 7D) with the gate insulating layer 4 therebetween to configure an auxiliary capacitance CS using the gate insulating layer 4 as a dielectric layer.

In the present embodiment, the patch electrode 15 is formed in a different layer from the source metal layer. Thus, the thickness of the source metal layer and the thickness of the patch electrode 15 can be controlled independently from each other.

The patch electrode 15 may include a Cu layer or an Al layer as a main layer. The performance of the scanned antenna is correlated with the electric resistance of the patch electrode 15, and the thickness of the main layer is set so that a desired resistance can be obtained. Preferably, the resistance of the patch electrode 15 is reduced to the extent that the oscillation of electrons is not hindered. When the metal layer of the patch electrode 15 is formed from an Al layer, the thickness of the metal layer is set to not less than 0.5 µm, for example.

The alignment film OM1 is made of a thin film that has been subjected to a photo-alignment treatment, the thin film including a polymer having a photoreactive functional group, which will be described later.

The TFT substrate 101 is produced by a method described below, for example. First, the dielectric substrate 1 is prepared. As the dielectric substrate 1, a glass substrate, a plastic substrate and the like that have heat resistance can be used, for example. On the dielectric substrate 1, the gate electrode 3 and a gate metal layer including the gate bus line GL are formed.

The gate electrode 3 may be formed integrally with the gate bus line GL. Herein, a gate conductive film (thickness: for example, from 50 nm to 500 nm inclusive) is formed on the dielectric substrate 1 by sputtering, for example. Then, the gate conductive film is patterned to form the gate electrode 3 and the gate bus line GL. The material of the gate conductive film is not particularly limited. For example, metals such as aluminum (Al), tungsten (W), molybdenum (Mo), tantalum (Ta), chromium (Cr), titanium (Ti), and copper (Cu) and alloys thereof, or a film including a metal nitride thereof may be used, as appropriate. Herein, as the gate conductive film, a layered film in which MoN (thickness: for example, 50 nm), Al (thickness: for example, 200 nm), and MoN (thickness: for example, 50 nm) are layered in this order is formed.

Then, the gate insulating layer 4 is formed so as to cover the gate metal layer. The gate insulating layer 4 may be formed by a CVD process, for example. As the gate insulating layer 4, a silicon oxide ($SiO_2$) layer, a silicon nitride (SiNx) layer, a silicon oxide nitride (SiOxNy; x>y) layer, a silicon nitride oxide (SiNxOy; x>y) layer or the like may be used, as appropriate. The gate insulating layer 4 may have a layered structure. Herein, as the gate insulating layer 4, a SiNx layer (thickness: for example, 410 nm) is formed.

Then, the semiconductor layer 5 and a contact layer are formed on the gate insulating layer 4. Herein, the island-like semiconductor layer 5 and the contact layer are obtained by forming an intrinsic amorphous silicon film (thickness: for example, 125 nm) and an $n^+$-type amorphous silicon film (thickness : for example, 65 nm) in this order and then performing patterning. The semiconductor film used for the semiconductor layer 5 is not limited to an amorphous silicon film. For example, as the semiconductor layer 5, an oxide semiconductor layer may be formed. In this case, the contact layer may not be provided between the semiconductor layer 5 and the source/drain electrodes.

Then, on the gate insulating layer 4 and the contact layer, a source conductive film (thickness: for example, from 50 nm to 500 nm inclusive) is formed and patterned to form the source metal layer including the source electrode 7S, the drain electrode 7D, and the source bus line SL. At this time, the contact layer is also etched to form the source contact layer 6S and the drain contact layer 6D which are separated from each other.

The material of the source conductive film is not particularly limited. For example, metals such as aluminum (Al), tungsten (W), molybdenum (Mo), tantalum (Ta), chromium (Cr), titanium (Ti), copper (Cu) and alloys thereof, or a film including a metal nitride thereof may be used, as appropriate. Herein, as the source conductive film, a layered film in which MoN (thickness: for example, 30 nm), Al (thickness: for example, 200 nm), and MoN (thickness: for example, 50 nm) are layered in this order is formed.

Herein, the source conductive film is formed by sputtering, for example, and then patterning (source/drain separation) of the source conductive film is performed by wet etching. Thereafter, a part positioned on a region of the contact layer corresponding to the channel region of the semiconductor layer 5 is removed by dry etching, for example, thereby forming a gap portion and separating the contact layer into the source contact layer 6S and the drain contact layer 6D. At this time, in the gap portion, the vicinity of the surface of the semiconductor layer 5 is also etched (over-etching).

Then, the first insulating layer 11 is formed so as to cover the TFT 10. In the present example, the first insulating layer 11 is arranged so as to contact the channel region of the semiconductor layer 5. Also, the contact hole CH1 reaching the drain electrode 7D is formed in the first insulating layer 11 by known photolithography technology.

The first insulating layer 11 may be an inorganic insulating layer, such as a silicon oxide ($SiO_2$) film, a silicon nitride (SiNx) film, a silicon oxide nitride (SiOxNy; x>y) film, and a silicon nitride oxide (SiNxOy; x>y) film. Herein, as the first insulating layer 11, a SiNx layer having a thickness of, for example, 330 nm is formed by CVD process, for example.

Then, a patch conductive film is formed on the first insulating layer 11 and in the contact hole CH1 and patterned. In this way, the patch electrode 15 is formed in the transmitting/receiving region R1. In the non-transmitting/receiving region R2, a patch connection portion made of the same conductive film (patch conductive film) as that of the patch electrode 15 is formed. The patch electrode 15 contacts the drain electrode 7D in the contact hole CH1.

As the material of the patch conductive film, the same material as that of the gate conductive film or the source conductive film may be used. However, it is preferable to set the patch conductive film to be thicker than the gate conductive film and the source conductive film. The thickness of the patch conductive film is preferably from 1 µm to 30 µm inclusive, for example. If the thickness is below the range, the transmittance with respect to electromagnetic waves would be of the order of 30% and the sheet resistance would be not less than 0.03 Ω/sq, potentially causing the problem of an increase in loss. If the thickness is above the range, the problem of deterioration in the patterning property of the slots 57 may be potentially caused.

Herein, as the patch conductive film, a layered film (MoN/Al/MoN) in which MoN (thickness: for example, 50 nm), Al (thickness: for example, 1000 nm), and MoN (thickness: for example, 50 nm) are layered in this order is formed.

Then, on the patch electrodes 15 and the first insulating layer 11, the second insulating layer (thickness: for example, from 100 nm to 300 nm inclusive) 17 is formed. The second insulating layer 17 is not particularly limited. For example, a silicon oxide ($SiO_2$) film, a silicon nitride ($SiNx$) film, a silicon oxide nitride ($SiOxNy$; x>y) film, or a silicon nitride oxide ($SiNxOy$; x>y) film may be used, as appropriate. Herein, as the second insulating layer 17, a SiNx layer having a thickness of 200 nm is formed, for example.

Thereafter, the inorganic insulating films (the second insulating layer 17, the first insulating layer 11, and the gate insulating layer 4) are etched at once by dry etching using a fluorine-based gas, for example. During the etching, the patch electrodes 15, the source bus line SL, and the gate bus line GL function as an etch-stop. In this way, a second contact hole reaching the gate bus line GL is formed in the second insulating layer 17, the first insulating layer 11, and the gate insulating layer 4, and a third contact hole reaching the source bus line SL is formed in the second insulating layer 17 and the first insulating layer 11. Also, in the second insulating layer 17, a fourth contact hole reaching the above-described patch connection portion is formed.

Then, a conductive film (thickness: from 50 nm to 200 nm inclusive) is formed on the second insulating layer 17 and in the second contact hole, the third contact hole, and the fourth contact hole by sputtering, for example. As the conductive film, it is possible to use a transparent conductive film, such as an indium tin oxide (ITO) film, an IZO film, and a zinc oxide (ZnO) film. Herein, as the conductive film, an ITO film having a thickness of 100 nm is used, for example.

Then, the transparent conductive film is patterned to form a gate-terminal upper connection portion, a source-terminal upper connection portion, and a transfer-terminal upper connection portion are formed. The gate-terminal upper connection portion, the source-terminal upper connection portion, and the transfer-terminal upper connection portion are used to protect electrodes or wires exposed in the respective terminal portions. In this way, the gate terminal portion GT, the source terminal portion ST, and the transfer terminal portion PT are obtained.

Then, a thin film made from an alignment agent including a polymer having a photoreactive functional group, which will be described later, is formed (an example of a thin-film forming step) so as to cover the second insulating layer 17 and the like. The thin film is then subjected to a photo-alignment treatment as will be described later, forming the alignment film OM1 provided with a predetermined alignment-regulating capability. The details of the alignment film OM1 will be described later. In this way, the TFT substrate 101 can be produced.

(Structure of Slot Substrate 201)

Figure 6:
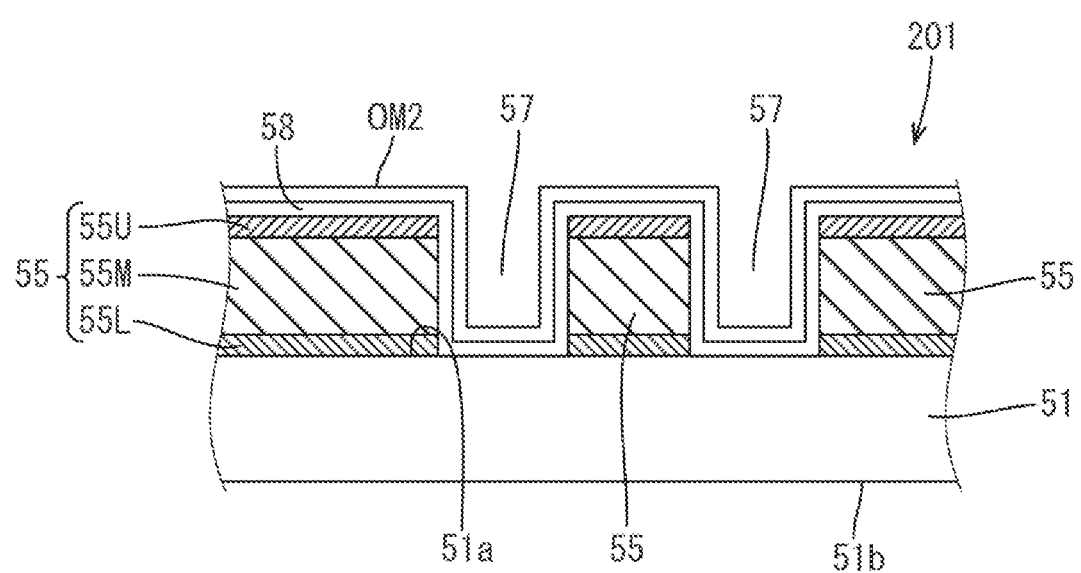
FIG. 6 is a cross sectional view schematically depicting an antenna unit region of a slot substrate.

The structure of the slot substrate 201 will be described in greater detail. FIG. 6 is a cross sectional view schematically depicting the antenna unit region U of the slot substrate 201.

The slot substrate 201 is provided with, mainly: the dielectric substrate (second dielectric substrate) 51; the slot electrode 55 formed on one plate surface (the plate surface facing the liquid crystal layer; the plate surface facing the TFT substrate 101) 51a of the dielectric substrate 51; a third insulating layer 58 covering the slot electrode 55; and the alignment film OM2 covering the third insulating layer 58.

In the transmitting/receiving region R1 of the slot substrate 201, the slot electrode 55 has the slots 57 formed therein (see FIG. 2). The slots 57 are openings (groove portions) penetrating through the slot electrode 55. In the present example, one slot 57 is allocated to each antenna unit region U.

The slot electrode 55 includes a main layer 55M, such as a Cu layer or an Al layer. The slot electrode 55 may have a layered structure in which the main layer 55M is sandwiched between an upper layer 55U and a lower layer 55L. The thickness of the main layer 55M is set in consideration of the skin effect in accordance with the material, and may be set to from 2 μm to 30 μm inclusive, for example. The thickness of the main layer 55M is typically set to be greater than the thickness of the upper layer 55U and the lower layer 55L.

In the present example, the main layer 55M is made of a Cu layer, and the upper layer 55U and the lower layer 55L are made of Ti layers. The lower layer 55L is arranged between the main layer 55M and the dielectric substrate 51 to improve the adhesion between the slot electrode 55 and the dielectric substrate 51. The upper layer 55U is provided to suppress corrosion of the main layer 55M (for example, a Cu layer).

The third insulating layer 58 is formed on the slot electrode 55 and in the slots 57. The material of the third insulating layer 58 is not particularly limited. For example, a silicon oxide (SiO2) film, a silicon nitride (SiNx) film, a silicon oxide nitride ($SiOxNy$; x>y) film, or a silicon nitride oxide ($SiNxOy$; x>y) film may be used, as appropriate.

The alignment film OM2, similarly to the alignment film OM1 of the TFT substrate 101, is made of a thin film that has been subjected to a photo-alignment treatment, the thin film including a polymer having a photoreactive functional group which will be described later.

In the non-transmitting/receiving region R2 of the slot substrate 201, the terminal portions IT are provided (see FIG. 3). The terminal portions IT are provided with a part of the slot electrode 55, the third insulating layer 58 covering a part of the slot electrode 55, and an upper connection portion. The third insulating layer 58 includes an opening (contact hole) reaching a part of the slot electrode 55. The upper connection portion is in contact with a part of the slot electrode 55 in the opening. In the present embodiment, the terminal portions IT are made of an electrically conductive layer, such as an ITO film or an IZO film, and are arranged in the sealing region Rs. The terminal portions IT are connected to the transfer terminal portions PT of the TFT substrate 101 by a sealing resin containing electrically conductive particles (for example, electrically conductive beads such as Au beads).

The slot substrate 201 is produced by a method described below, for example. First, the dielectric substrate 51 is prepared. As the dielectric substrate 51, it is possible to use a substrate, such as a glass substrate and a resin substrate, having a high transmittance with respect to electromagnetic waves (small dielectric constant εM and dielectric loss tan δM). Preferably, the dielectric substrate 51 has a small thickness in order to suppress attenuation of electromagnetic waves. For example, after constituent elements such as the slot electrode 55 have been formed on the surface of the glass substrate by a process which will be described later, the thickness of the glass substrate may be reduced from the back surface side. In this way, it is possible to set the thickness of the glass substrate to be not more than 500 µm, for example. Generally, resins have smaller dielectric constant εM and dielectric loss tan δM than glass. When the dielectric substrate 51 is made of a resin substrate, the thickness of the substrate is from 3 µm to 300 µm inclusive, for example. As the material of the resin base material, polyimide and the like may be used.

A metal film is formed on the dielectric substrate 51 and patterned to obtain the slot electrode 55 having the slots 57. As the metal film, a Cu film (or an Al film) having a thickness of from 2 µm to 5 µm inclusive may be used. Herein, a layered film in which a Ti film, a Cu film, and a Ti film are layered in this order is used.

Then, the third insulating layer (thickness: for example, from 100 nm to 200 nm inclusive) 58 is formed on the slot electrode 55 and in the slots 57. Herein the third insulating layer 52 is made of a silicon oxide ($SiO_2$) film.

Thereafter, in the non-transmitting/receiving region R2, openings (contact holes) reaching a part of the slot electrode 55 are formed in the third insulating layer 58.

Then, a transparent conductive film is formed on the third insulating layer 58 and in the openings of the third insulating layer 58. The transparent conductive film is then patterned to form the upper connection portion contacting a part of the slot electrode 55 in the openings, whereby the terminal portions IT for connection with the transfer terminal portions PT of the TFT substrate 101 are obtained.

Thereafter, a thin film made from an alignment agent including a polymer having a photoreactive functional group, which will be described later, is formed (an example of a thin-film forming step) so as to cover the third insulating layer 58. The thin film is then subjected to a photo-alignment treatment which will be described later, whereby the alignment film OM2 provided with a predetermined alignment-regulating capability is formed. The details of the alignment film OM2 will be described later. In this way, the slot substrate 201 can be produced.

(Configuration of Waveguide 301)

The waveguide 301 is configured such that the reflecting conductive plate 65 is opposed to the slot electrode 55 with the dielectric substrate 51 therebetween. The reflecting conductive plate 65 is disposed so as to oppose the back surface of the dielectric substrate 51 with the air layer 54 therebetween. The reflecting conductive plate 65 constitutes a wall of the waveguide 301. Accordingly, the reflecting conductive plate 65 preferably has a thickness which is at least three times and preferably at least five times the skin depth. As the reflecting conductive plate 65, an aluminum plate, a copperplate and the like fabricated by machining and having a thickness of the order of several millimeters may be used, for example.

For example, when the scanned antenna 1000 transmits, the waveguide 301 guides microwaves supplied from the feeder pin 72, which is arranged at the center of the concentrically arrayed antenna units U, so as to radially extend outward. The microwaves as they move in the waveguide 301 are cut by the slots 57 in the respective antenna units U, and an electric field is generated by the principle of a so-called slot antenna. The electric field causes charges to be induced in the slot electrode 55 (that is, the microwaves are converted into the oscillation of free electrons in the slot electrode 55). In each antenna unit U, the capacitance value of the liquid crystal capacitance is varied through liquid crystal alignment control, whereby the phase of the oscillation of free electrons induced in the patch electrodes 15 is controlled. As charges are induced in the patch electrodes 15, an electric field is generated (That is, the oscillation of free electrons in the slot electrode 55 is transferred to the oscillation of free electrons in the patch electrodes 15), and microwaves (radio waves) are oscillated from the patch electrodes 15 of the respective antenna units U toward the outside of the TFT substrate 101. The microwaves (radio waves) oscillated from the antenna units U and having different phases are summed, whereby the azimuth angle of a beam is controlled.

In other embodiments, a double-layer structure may be adopted in which the waveguide is divided into an upper layer and a lower layer. In this case, the microwaves supplied from the feeder pin first move in the lower layer so as to extend radially outward from the center. The microwaves then rise up to the upper layer at the outer wall portion of the lower layer and move in the upper layer to gather at the center from the outside. With the double-layer structure, it becomes easier for the microwaves to spread to the respective antenna units U uniformly.

(Alignment film OM (OM1, OM2))

The alignment films OM1, OM2 (which may be hereafter collectively referred to as an "alignment film OM") utilized in the TFT substrate 101 and the slot substrate 201 of the present embodiment are made of a thin film of a polymer (polymer material) including a photoreactive functional group, the thin film having been subjected to a photo-alignment treatment. The alignment film OM is provided with a function for causing liquid crystal molecules (liquid crystal compound) to be aligned (alignment-regulating capability) in a direction orthogonal to a polarization axis of light (p-polarized light) that is irradiated during the photo-alignment treatment.

Figure 7:
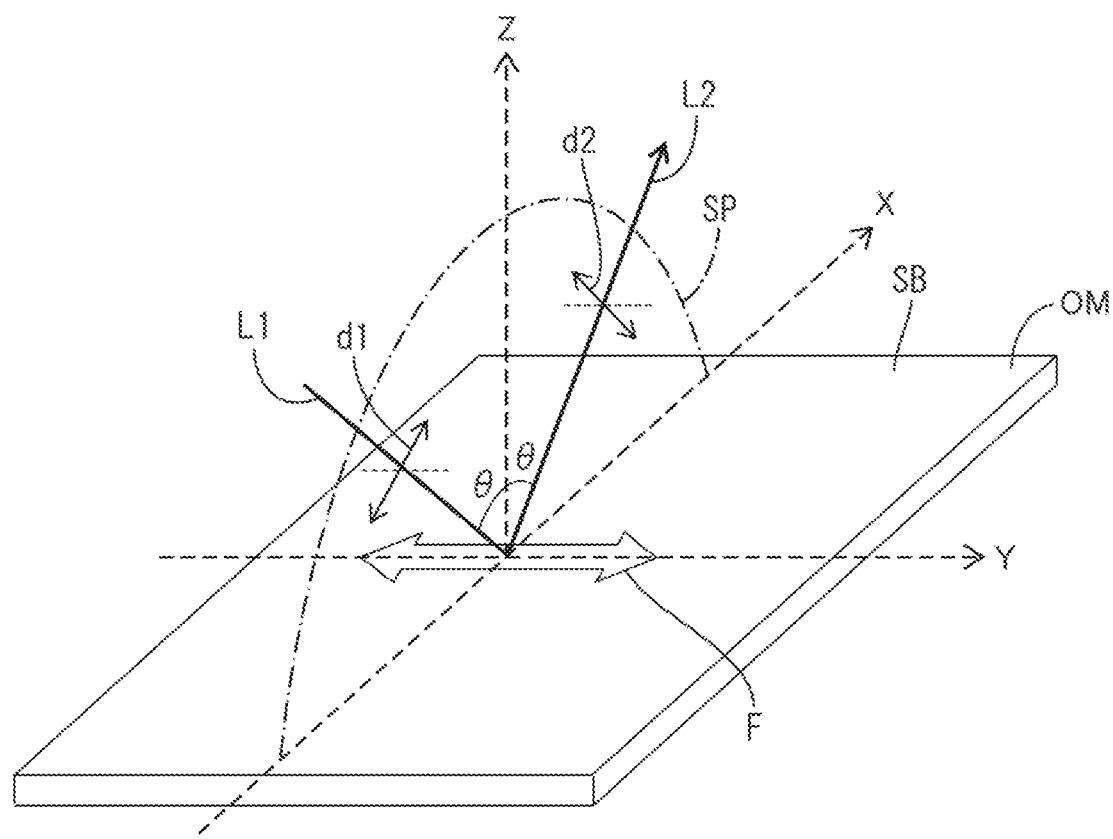
FIG. 7 is an illustrative diagram schematically depicting the relationship between the direction of a polarization axis of light with which an alignment film is irradiated and the direction in which the alignment film aligns the liquid crystal molecules during a photo-alignment treatment.

FIG. 7 is an illustrative diagram schematically depicting the relationship between the direction of a polarization axis d1 of light with which the alignment film OM is irradiated during the photo-alignment treatment, and the direction in which the alignment film OM aligns the liquid crystal molecules. FIG. 7 depicts light (entry light, p-polarized light) L1 which enters the alignment film OM during the photo-alignment treatment, and light (reflected light, p-polarized light) L2 reflected by the electrode on the lower side of the alignment film OM. The entry light L1 and the reflected light L2 are present in an entry plane SP perpendicular to a boundary surface (X-Y plane) SB provided by a surface of the alignment film OM. For convenience of description, it is assumed that the entry light L1 travels in the alignment film OM from the front side toward the back side thereof in a state of being inclined at an angle θ(°) from the normal (the Z-axis), and that the reflected light L2 travels in the alignment film OM from the back side toward the front side thereof in a state of being inclined at an angle θ(°) from the normal (the Z-axis).

The entry light L1 and the reflected light L2 herein refer to linearly polarized light (i.e., p-polarized light) of which the plane of vibration is parallel to the entry plane SP. FIG. 7 depicts a polarization axis d1 of the entry light (p-polarized light) L1, and a polarization axis d2 of the reflected light (p-polarized light) L2. As depicted in FIG. 7, when the entry light (p-polarized light) L1 enters the alignment film OM at the angle θ (for example, 45°), in the alignment film OM, the entry light L1 causes the exhibition of a function for aligning the liquid crystal molecules in a direction (Y-axis direction, the direction indicated by arrows F in FIG. 7) orthogonal to the polarization axis d1.

The entry light L1, when reflected by the electrode (metal) on the back side (lower side) of the alignment film OM, becomes the reflected light (p-polarized light) L2 having the polarization axis d2 which is rotated by 90° with respect to the polarization axis d1. The polarization axis d2 of the reflected light L2, even after rotated with respect to the polarization axis d1, is in the entry plane SP, similarly to the entry light L1 (That is, the plane of vibration is parallel to the entry plane SP). Thus, in the alignment film OM, the reflected light L2 also causes the exhibition of the function for aligning the liquid crystal molecules in a direction (the Y-axis direction, similarly to the entry light L1) orthogonal to the polarization axis d2.

Thus, by utilizing, as the alignment film OM, a polymer that exhibits an alignment function (alignment-regulating capability) by which the liquid crystal molecules are aligned in a direction orthogonal to the polarization axis of the light (p-polarized light) irradiated during the photo-alignment treatment, the alignment function (alignment-regulating capability) can be exhibited by the reflected light L2 as well as by the entry light L1.

If, as the alignment film, a polymer that exhibits an alignment function (alignment-regulating capability) that aligns liquid crystal molecules in a direction parallel to the polarization axis of the light (p-polarized light) irradiated during the photo-alignment treatment is utilized, for example, the alignment function obtained provided by the entry light would be cancelled out by the reflected light.

Next, a photoreactive polymer material (polymer including a photoreactive functional group) utilized for the alignment film OM will be described.

(Polymer having Cinnamate Group)

An example of a polymer including a photoreactive functional group for the alignment film OM is a polymer having a cinnamate group in a side chain and expressed by the following chemical formula (1).

[C1]

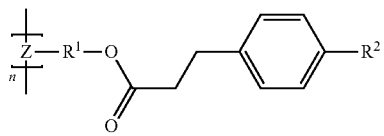

(1)

In chemical formula (1), n is an integer of 2 or more, Z is an arbitrary structure configuring a main chain, $R^1$ is an arbitrary linking group linking the main chain and the cinnamate group, and $R^2$ is an arbitrary substitution group.

In chemical formula (1), specific examples of Z include —$CH_2$—CH— and —$CH_2$—$C(CH_3)$—. The main chain of the polymer of chemical formula (1) may be configured from polyamic acid, polyimide or the like.

In chemical formula (1), specific examples of $R^1$ include ester groups, ether groups, and alkylene groups such as methylene groups, and direct linkages (without $R^1$). Specific examples of $R^2$ include a hydrogen atom, alkyl groups such as methyl groups, and alkoxy groups such as methoxy groups.

Among the polymers expressed by chemical formula (1), an example of a polymer having the simplest structure is the polymer expressed by the following chemical formula (2).

[C2]

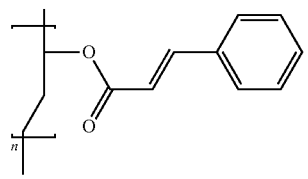

(2)

The polymer expressed by chemical formula (2) is a case of chemical formula (1) in which Z is —$CH_2$—CH—, $R^1$ is a direct linkage (without $R^1$), and $R^2$ is a hydrogen atom.

Figure 8:
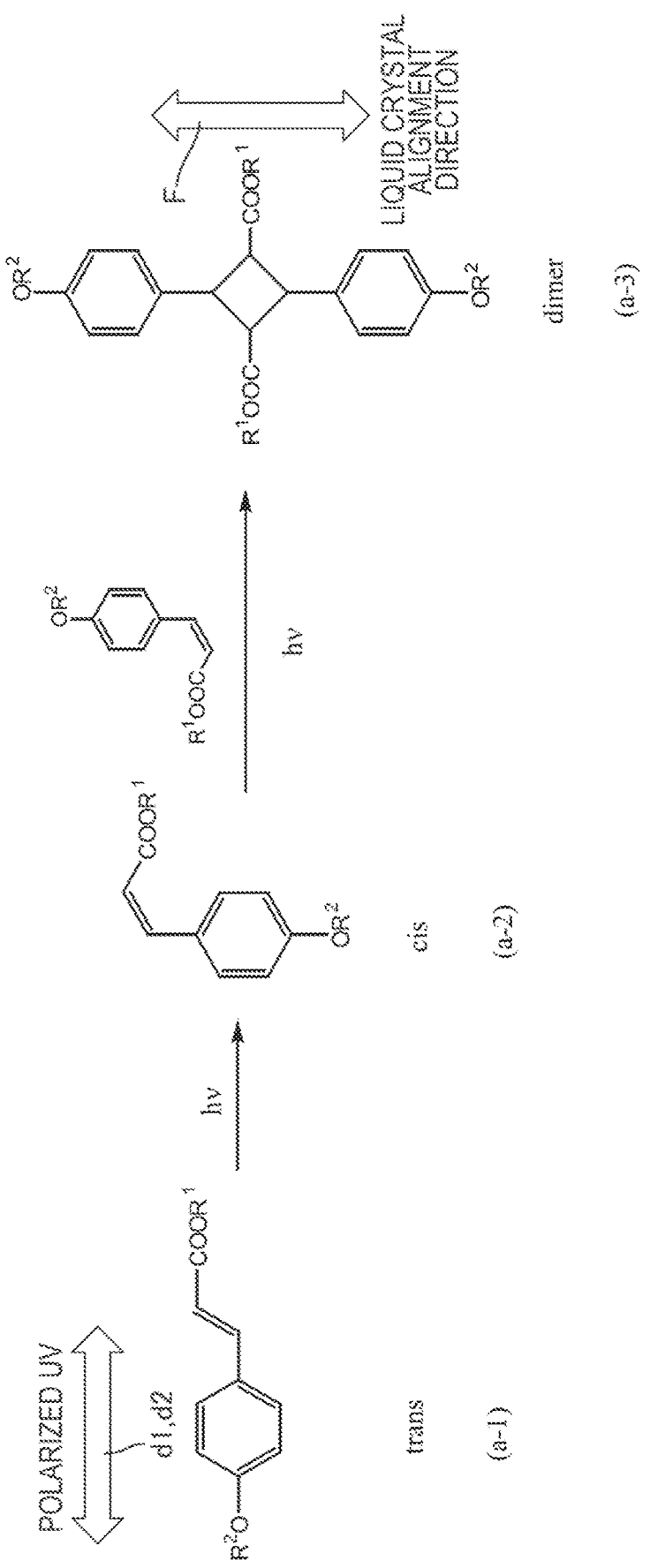
FIG. 8 is an illustrative diagram depicting the scheme of photoreaction of a cinnamate group.

Photoreaction of a polymer having a cinnamate group in a side chain and expressed by chemical formula (1) will be described with reference to FIG. 8. FIG. 8 is an illustrative diagram depicting the scheme of photoreaction of a cinnamate group. In FIG. 8, for convenience of description, the main chain portion of the polymer is omitted. As depicted in FIG. 8, the structure (a-1) including a cinnamate group of a trans form, upon being irradiated with light (for example, polarized ultraviolet light), becomes a structure (a-2) including a cinnamate group that has isomerized to a cis form (isomerization reaction). If the structure (a-2) is further irradiated with light, the structures (a-2) dimerize to form a cyclo ring, whereby a structure (a-3) is obtained.

The polarization axes d1, d2 of the light for photoreaction of the structure (a-1) including a cinnamate group of a trans form are in the direction (left-right direction) of arrows indicated in FIG. 8. The direction in which the liquid crystal molecules are aligned by the structure (a-3) obtained by dimerization is a direction (up-down direction) which, as indicated by arrows F in FIG. 8, is orthogonal to the polarization axes d1, d2. The liquid crystal molecules are aligned in the direction in which an aromatic ring portion and an aliphatic ring portion of the cinnamate group are arrayed. In this way, a polymer having a cinnamate group in a side chain is subjected to photoreaction, whereby the liquid crystal molecules (liquid crystal compound) can be aligned in a direction orthogonal to the polarization axes d1, d2 of light (p-polarized light).

(Polymer including Azobenzene Group)

As a polymer including a photoreactive functional group and utilized in the alignment film OM, a polymer including an azobenzene group will be described by way of example. An example of the polymer including an azobenzene group is a polymer expressed by the following chemical formula (3).

[C3]

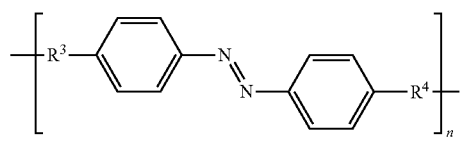

(3)

In chemical formula (3), n is an integer of 2 or more, $R^3$ and $R^4$ are each an arbitrary structure configuring a main chain. $R^4$ is not essential and may be omitted.

A specific example of the polymer expressed by chemical formula (3) is a polymer obtained by imidizing a polyamic acid expressed by the following chemical formula (4), as indicated by the following chemical formula (5).

[C4]

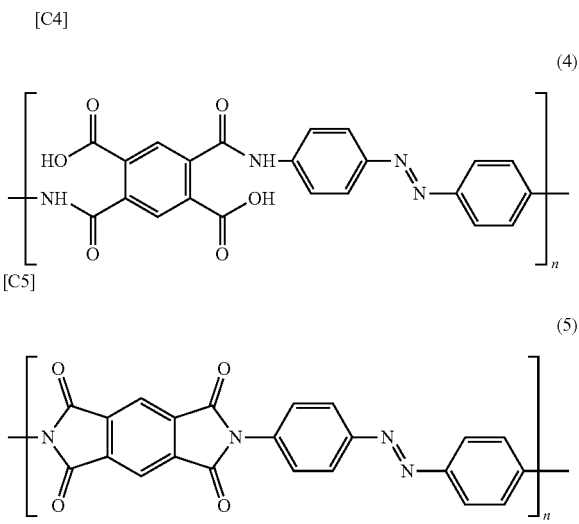

(4)

[C5]

(5)

In chemical formula (4) and chemical formula (5), n is an integer of 2 or more.

Imidization of the polyamic acid expressed by chemical formula (4) is performed by, for example, treating the polyamic acid at high temperature (for example, from 200 to 250° C.). Also, a chemical imidization process in which an acetic anhydride or the like is used as a dehydration agent and pyridine or the like is used as a catalyst may be used. The imidization rate of the polyimide expressed by chemical formula (5) is not particularly limited as long as the imidization rate does not detract from the object of the present invention. Preferably, the imidization rate is not less than 50%, for example.

Figure 9:
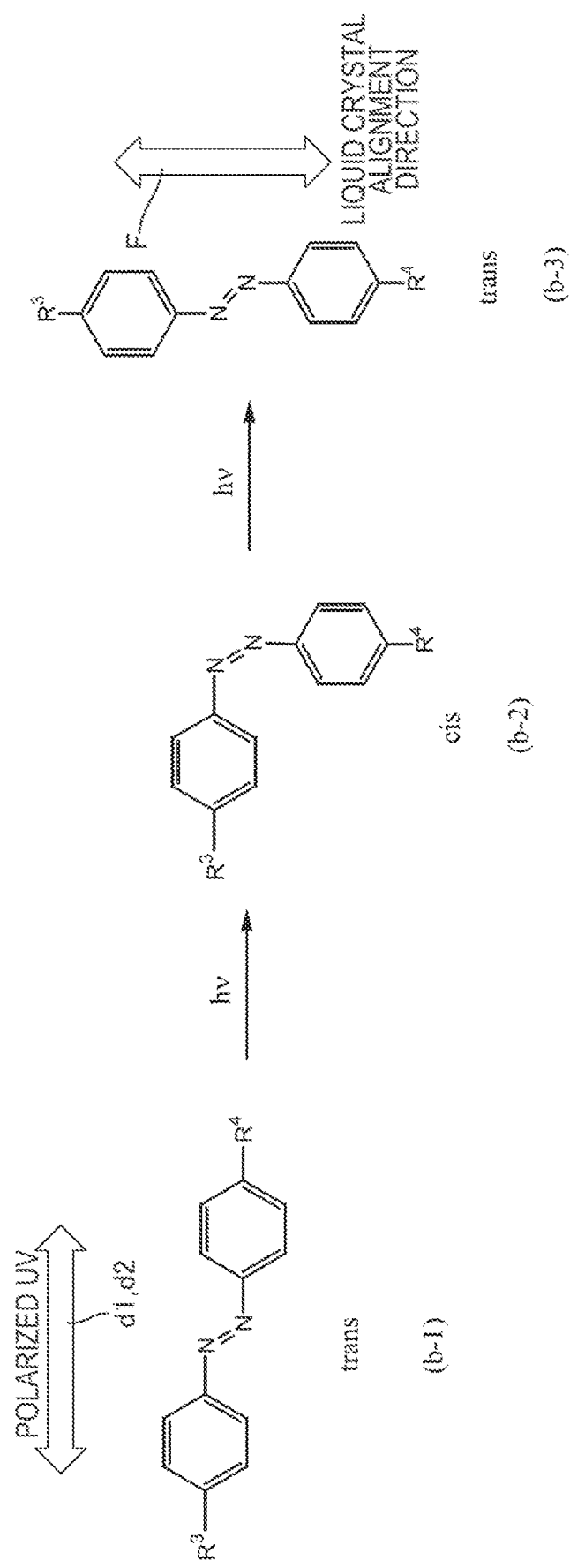
FIG. 9 is an illustrative diagram depicting the scheme of photoreaction of an azobenzene group.

The photoreaction of a polymer including an azobenzene group and expressed by chemical formula (3) will be described with reference to FIG. 9. FIG. 9 is an illustrative diagram depicting the scheme of photoreaction of an azobenzene group. As depicted in FIG. 9, a structure (b-1) including an azobenzene group of a trans form, upon being irradiated with light (for example, polarized ultraviolet light), becomes a structure (b-2) including the azobenzene group that has been isomerized to a cis form. The polarization axes d1, d2 of the light for photoreaction of the structure (b-1) including an azobenzene group of a trans form are in the direction (left-right direction) expressed by arrows in FIG. 9.

The structure (b-1) of a trans form and the structure (b-2) of a cis form are reversibly isomerized by light or heat. FIG. 9 depicts a structure (b-3) including an azobenzene group obtained by isomerization of the azobenzene group of the structure (b-2) of a cis form into a trans form by light. The azobenzene group of a trans form in the structure (b-3) is rotated by 90° with respect to the azobenzene group of a trans form in the structure (b-1). The structure (b-2) including an azobenzene group of a cis form includes a structure, as in the structure (b-3), in which the orientation of the azobenzene group is rotated by 90° when isomerized to a trans form. When the orientation of the azobenzene group is rotated by 90°, the structure (b-3) ceases to absorb light having the polarization axes d1, d2 and becomes stabilized. In the structure (b-2) including an azobenzene group of a cis form, a structure that has returned to the structure (b-1) absorbs light again and becomes the structure (b-2) including an azobenzene group of a cis form, and, at a certain probability, becomes the structure (b-3) which is stable with respect to light. As such isomerization is repeated, the ratio of the structure (b-3) increases over time, and anisotropy is exhibited in the polymer including the structure (b-3). The structure (b-3) aligns the liquid crystal molecules in a direction (up-down direction) which, as indicated by arrows F in FIG. 9, is orthogonal to the polarization axes d1, d2. In this way, the polymer including an azobenzene group is subjected to photoreaction, making it possible to align the liquid crystal molecules (liquid crystal compound) in a direction orthogonal to the polarization axes d1, d2 of the light (p-polarized light).

(Polymer having Cyclobutane Diimide Structure)

As a polymer including a photoreactive functional group utilized in the alignment film OM, a polymer having a cyclobutane diimide structure will be described by way of example. An example of the polymer having a cyclobutane diimide structure is a polymer expressed by the following chemical formula (6).

[C6]

(6)

In chemical formula (6), x is an integer of 2 or more, $R^5$ and $R^6$ are each an arbitrary structure configuring a main chain. $R^5$ is not essential and may be omitted.

When a polymer expressed by chemical formula (6) is subjected to photoreaction, cleavage (photocleavage) occurs at a cyclobutane ring portion, yielding a structure expressed by the following chemical formula (7).

[C7]

(7)

In chemical formula (7), y is an integer of one or more, and $R^5$ and $R^6$ are the same as those of chemical formula (6).

A specific example of the polymer expressed by chemical formula (6) is a polymer expressed by the following chemical formula (8).

[C8]

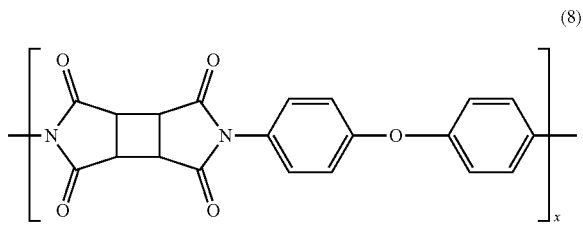

(8)

In chemical formula (8), x is an integer of 2 or more.

As a polymer expressed by chemical formula (8) is subjected to photoreaction, cleavage (photocleavage) occurs at a cyclobutane ring portion, yielding a structure expressed by the following chemical formula (9).

[C9]

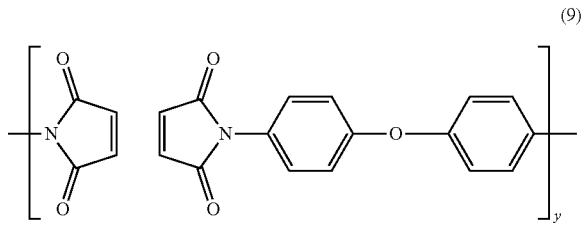

(9)

In chemical formula (9), y is an integer of one or more.

Figure 10:
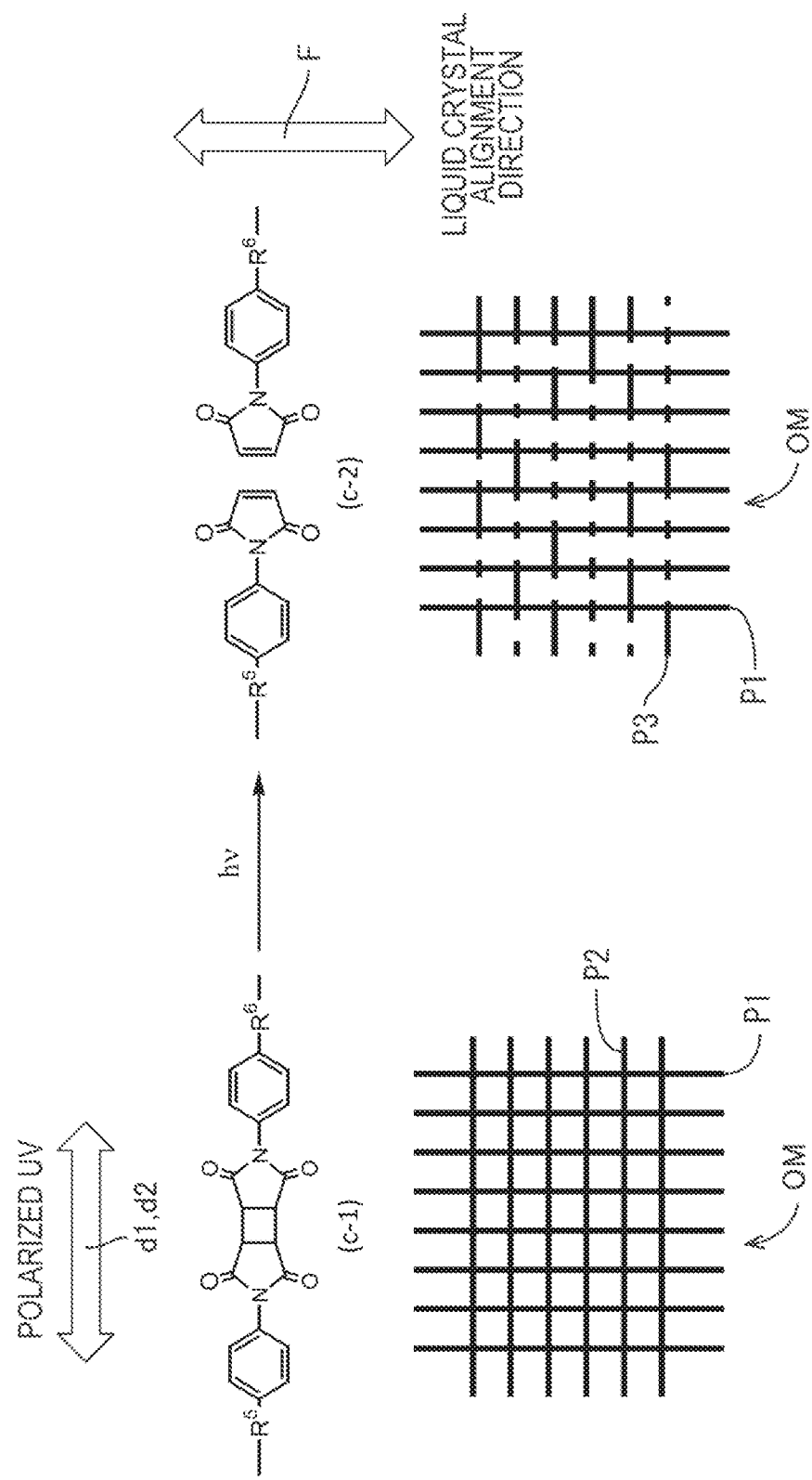
FIG. 10 is an illustrative diagram schematically depicting a photoreaction of a polymer having a cyclobutane diimide structure.

Photoreaction of a polymer expressed by chemical formula (8) having a cyclobutane diimide structure will be described with reference to FIG. 10. FIG. 10 is an illustrative diagram schematically depicting a photoreaction of a polymer having a cyclobutane diimide structure. As depicted in FIG. 10, a structure (c-1) having a cyclobutane diimide structure, upon being irradiated with light (for example, polarized ultraviolet light), becomes a structure (c-2) in which cyclobutane ring portions of the cyclobutane diimide structure are cleaved. The polarization axes d1, d2 of the light for photoreaction of the structure (c-1) including the cyclobutane diimide structure are in a direction (left-right direction) expressed by arrows in FIG. 10. That is, the cyclobutane diimide structure of the structure (c-1) is in the polarization axes d1, d2 of the light.

FIG. 10 schematically depicts the alignment film OM including the structure (c-1) before photoreaction, and the alignment film OM including the structure (c-2) after photoreaction. In the alignment film OM before photoreaction, there is no regularity in the direction of molecule chains. However, for convenience of description, polymers P1 arrayed in the vertical direction and polymers P2 arrayed in the horizontal direction are schematically depicted as intersecting each other, forming a lattice. In the polymers P2, as in the structure (c-1) indicated in FIG. 10, the cyclobutane diimide structures are disposed in the horizontal direction (left-right direction). On the other hand, in the polymers P1, the cyclobutane diimide structures are disposed in the vertical direction (up-down direction). As the alignment film OM before photoreaction is irradiated with light having the polarization axes d1, d2, the cyclobutane diimide structures in the polymers P2 in the polarization axes d1, d2 are subjected to photoreaction and dissolved into the structure (c-2). On the other hand, the cyclobutane diimide structures in the polymers P1 arrayed orthogonal to the polarization axes d1, d2 are not subjected to photoreaction and are not dissolved.

As a result, as depicted in FIG. 10, the alignment film OM after photoreaction including the structure (c-2) is formed. In the alignment film OM after photoreaction, the polymers P1 arrayed in the vertical direction remain without being cut. However, in the horizontal direction, polymers P3 in which the cyclobutane diimide structures are cut here and there are arrayed. In the alignment film OM after photoreaction, anisotropy is exhibited in the direction of the polymers (mainly, polymers P1) that have remained without being cut. That is, in the alignment film OM after photoreaction, as indicated by arrows F in FIG. 10, the liquid crystal molecules are aligned in a direction (up-down direction) orthogonal to the polarization axes d1, d2. In this way, the polymer having a cyclobutane diimide structure is subjected to photoreaction, making it possible to align the liquid crystal molecules (liquid crystal compound) in a direction orthogonal to the polarization axes d1, d2 of the light (p-polarized light).

The alignment film OM described above by way of example may be a horizontal alignment film of which the film alignment direction (initial alignment) is horizontal to the substrate plane, or may be a vertical alignment film of which the alignment direction (initial alignment) is vertical to the substrate plane.

In the present embodiment, the alignment film OM (alignment films OM1, OM2) is formed on the surface of each of the TFT substrate 101 and the slot substrate 201. In other embodiments, the alignment film OM may be formed on the surface of only one of the TFT substrate 101 and the slot substrate 201.

(Liquid Crystal Layer LC (Liquid Crystal Compound))

As the liquid crystal material (liquid crystal compound) configuring the liquid crystal layer, an isothiocyanate group-containing liquid crystal compound having a large dielectric constant anisotropy ($\Delta\varepsilon$) (for example, 10 or more) is used. Examples of the isothiocyanate group-containing liquid crystal compound include those expressed by the following chemical formula (10-1) and chemical formula (10-2).

[C10]

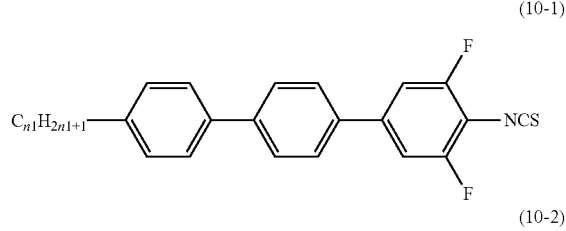

(10-1)

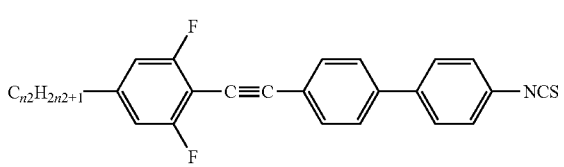

(10-2)

In chemical formula (10-1) and chemical formula (10-2), n1 and n2 are each an integer of from 1 to 5, and the H in the aromatic ring portion may be substituted with F or Cl.

The liquid crystal material may include a liquid crystal compound other than the isothiocyanate group-containing liquid crystal compound as long as the compound does not detract from the object of the present invention.

Examples of known documents disclosing liquid crystal compounds that can be utilized in the liquid crystal layer LC include Japanese Patent Nos. 5859962 and 5859189. The liquid crystal compounds disclosed therein may be utilized, as appropriate.

The liquid crystal material (liquid crystal compound) configuring the liquid crystal layer LC utilized in the liquid crystal cell for a scanned antenna has high polarity, and is prone to take in ions generated from other members such as the alignment film and sealing material. If ions are taken into the liquid crystal layer LC, a problem of the voltage holding ratio (VHR) and the like of the liquid crystal cell C may occur. Thus, from this viewpoint, it is preferable to use an alignment film which does not generate radicals that could become an ion generating source during photo-alignment treatment. Specifically, it is preferable to use isomerization-type and dimerization-type alignment films.

(Antenna unit U)

Figure 11:
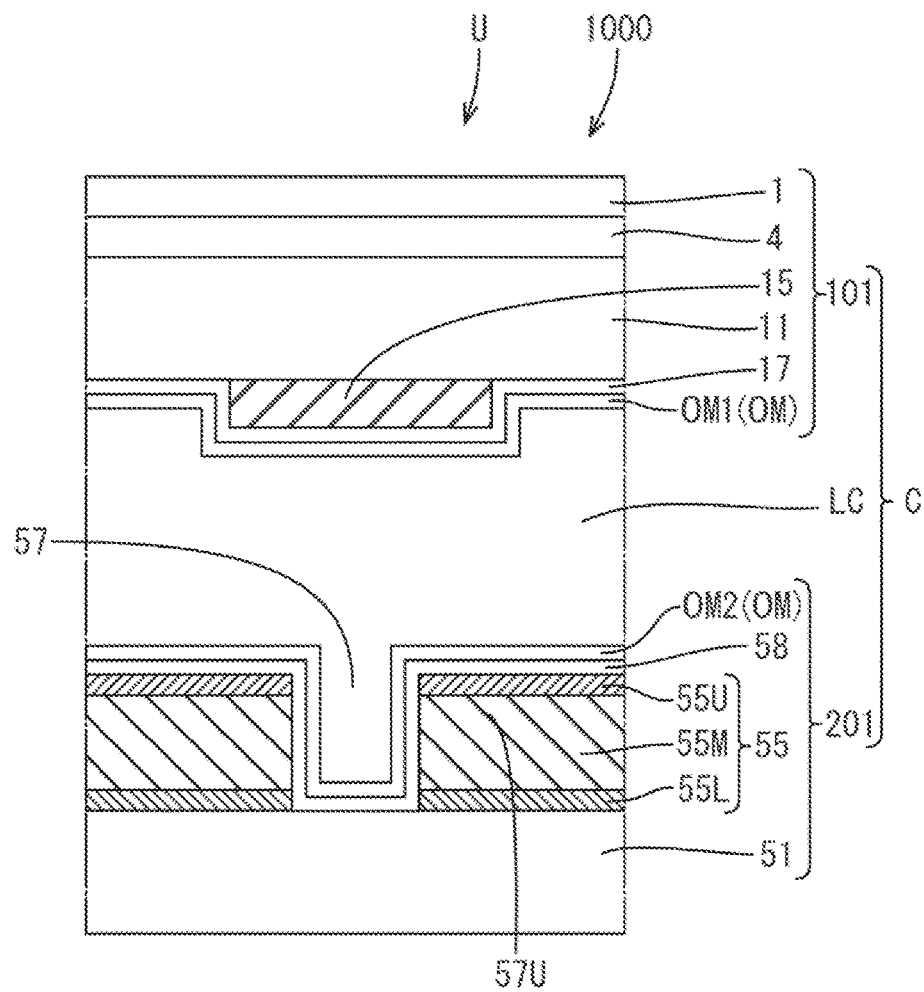
FIG. 11 is a cross sectional view schematically depicting a TFT substrate, a liquid crystal layer, and a slot substrate which configure an antenna unit of a scanned antenna.

FIG. 11 is a cross sectional view schematically depicting the TFT substrate 101, the liquid crystal layer LC, and the slot substrate 201 configuring the antenna unit U of the scanned antenna 1000. As depicted in FIG. 11, in the antenna unit U, the island-like patch electrode 15 of the TFT substrate 101 and the hole-like (grooved) slot 57 (slot electrode unit 57U) of the slot electrode 55 of the slot substrate 201 are opposed to each other with the liquid crystal layer LC sandwiched therebetween. The scanned antenna 1000 is provided with a liquid crystal cell C which includes the liquid crystal layer LC and a pair of the TFT substrate 101 and the slot substrate 201 sandwiching the liquid crystal layer LC and respectively including the alignment films OM1, OM2 on the surface thereof on the liquid crystal layer LC side. In the present description, the antenna unit U is configured from one patch electrode 15, and the slot electrode 55 (slot electrode unit 57U) in which at least one slot 57 corresponding to the patch electrode 15 is disposed.

(Liquid Crystal Cell C)

Figure 12:
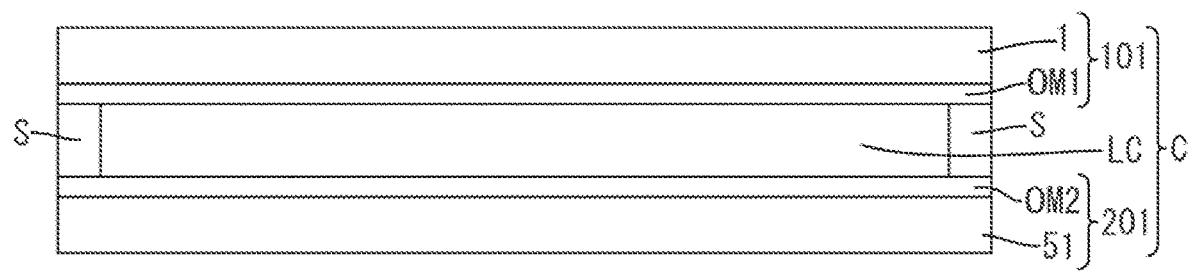
FIG. 12 is a cross sectional view schematically depicting the configuration of a liquid crystal cell.

FIG. 12 is a cross sectional view schematically depicting the configuration of the liquid crystal cell C. Between a pair of electrode-attached substrates, i.e., the TFT substrate 101 and the slot substrate 201 configuring the liquid crystal cell C, a sealing material S is disposed so as to surround the liquid crystal layer LC. The sealing material S is adhered to each of the TFT substrate 101 and the slot substrate 201, and provides the function of affixing the TFT substrate 101 and the slot substrate 201 to each other. The TFT substrate 101 and the slot substrate 201 form a pair of substrates facing each other across the liquid crystal layer LC. The sealing material S is made from a cured product of a sealing material composition containing a curable resin.

(Method of Producing Liquid Crystal Cell C)

A method of producing the liquid crystal cell C includes: a thin-film forming step of forming, on a surface of at least one electrode-attached substrate of a pair of electrode-attached substrates including the TFT substrate 101 and the slot substrate 201, the TFT substrate 101 including a first dielectric substrate, TFTs supported on the first dielectric substrate, and patch electrodes electrically connected to the TFTs, the slot substrate 201 including a second dielectric substrate and a slot electrode supported on the second dielectric substrate and having slots, a thin film including a polymer having a photoreactive functional group so as to cover the patch electrodes and/or the slot electrode; and a light irradiating step of irradiating the thin film with light including p-polarized light to provide the thin film with alignment-regulating capability for aligning liquid crystal molecules to thereby obtain an alignment film. The method is characterized in that the polymer exhibits alignment-regulating capability for aligning the liquid crystal molecules in a direction orthogonal to a polarization axis of the p-polarized light.

In the thin-film forming step, an alignment agent obtained by dissolving a polymer including the photoreactive functional group in a predetermined organic solvent is applied to a surface of at least one of the pair of electrode-attached substrates (the TFT substrate 101 and the slot substrate 201), whereby a thin film made from the alignment agent is formed on the surface of the electrode-attached substrate. The thin film may be applied onto the substrate by a method using a known technique. The thin film may be heated and dried for the purpose of solvent removal or curing, for example.

In the light irradiating step, the thin film formed on the electrode-attached substrate is irradiated with polarized ultraviolet light (including p-polarized light), for example. Then, the polymer in the thin film is subjected to photoreaction, providing the thin film with alignment-regulating capability for aligning the liquid crystal molecules in a direction orthogonal to the polarization axis of the p-polarized light of the polarized ultraviolet light. As a result, the alignment film OM provided with a predetermined alignment-regulating capability can be obtained from the thin film.

The TFT substrate 101 formed with the alignment film OM (OM1, OM2) as described above and the slot substrate 201 are affixed to each other with the sealing material S therebetween, and the liquid crystal layer LC is injected between the TFT substrate 101 and the slot substrate 201. The liquid crystal material may be injected by a method such as a drop injection method (ODF method), for example.

(Method of Producing Scanned Antenna)

After the liquid crystal cell C has been produced using the one drop fill method and the like, the reflecting conductive plate 65 is assembled onto the cell side so as to oppose the opposite surface of the slot substrate 201 (second dielectric substrate 51), as appropriate, via the dielectric (air layer) 54. Through the above steps, the scanned antenna of the present embodiment is produced.

EXPLANATION OF SYMBOLS

1: Dielectric substrate (First dielectric substrate)
3: Gate electrode
4: Gate insulating layer
5: Semiconductor layer
6D: Drain contact layer
6S: Source contact layer
7D: Drain electrode
7S: Source electrode
10: TFT
11: First insulating layer
15: Patch electrode
17: Second insulating layer
51: Dielectric substrate (Second dielectric substrate)
55: Slot electrode
55L: Lower layer
55M: Main layer
55U: Upper layer
57: Slot
57U: Slot electrode unit
58: Third insulating layer
70: Feed device 72: Feeder pin
101: TFT substrate
201: Slot substrate
1000: Scanned antenna
U: Antenna unit (Antenna unit region)
CH1: Contact hole
LC: Liquid crystal layer
C: Liquid crystal cell
GD: Gate driver
GL: Gate bus line
GT: Gate terminal portion
SD: Source driver
SL: Source bus line
ST: Source terminal portion
PT: Transfer terminal portion
R1: Transmitting/receiving region
R2: Non-transmitting/receiving region
Rs: Sealing region
S: Sealing material
OM, OM1, OM2: Alignment film
C: Liquid crystal cell
L1: Entry light (p-polarized light)
L2: Reflected light (p-polarized light)
d1: Polarization axis of entry light
d2: Polarization axis of reflected light
SP: Entry plane
SB: Boundary surface (Surface of alignment film)

The invention claimed is:

1. A method of producing a liquid crystal cell, the method comprising:
   a thin-film forming step of forming, on a surface of at least one electrode-attached substrate of a pair of electrode-attached substrates including a TFT substrate and a slot substrate, the TFT substrate including a first dielectric substrate, a plurality of TFTs supported on the first dielectric substrate, and a plurality of patch electrodes electrically connected to the TFTs, the slot substrate including a second dielectric substrate and a slot electrode supported on the second dielectric substrate and having a plurality of slots, a thin film so as to cover the patch electrodes and/or the slot electrode; and
   a light irradiating step of irradiating the thin film with light including p-polarized light to provide the thin film with alignment-regulating capability of aligning liquid crystal molecules to thereby obtain an alignment film, wherein the thin film includes a polymer including a photoreactive functional group and exhibiting the alignment-regulating capability of the thin film in a direction orthogonal to a polarization axis of the p-polarized light.

2. The method of producing a liquid crystal cell according to claim 1, wherein the thin film exhibits the alignment-regulating capability due to isomerization of the photoreactive functional group of the polymer.

3. The method of producing a liquid crystal cell according to claim 2, wherein the thin film exhibits the alignment-regulating capability due to dimerization of the photoreactive functional group of the polymer after isomerization.

4. The method of producing a liquid crystal cell according to claim 1, wherein the thin film exhibits the alignment-regulating capability due to photocleavage of the photoreactive functional group of the polymer.

5. The method of producing a liquid crystal cell according to claim 1, wherein the thin film includes a cinnamate group as the photoreactive functional group of the polymer.

6. The method of producing a liquid crystal cell according to claim 1, wherein the thin film includes an azobenzene group as the photoreactive functional group of the polymer.

7. The method of producing a liquid crystal cell according to claim 1, wherein the thin film includes a cyclobutane diimide structure as the photoreactive functional group of the polymer.

8. The method of producing a liquid crystal cell according to claim 1, wherein the patch electrodes and the slot electrode are made of a metal or an alloy.

9. A liquid crystal cell comprising:
   a pair of the TFT substrate and the slot substrate having on at least one surface thereof the alignment film obtained by the method of producing a liquid crystal cell according to claim 1; and
   a liquid crystal layer interposed between the TFT substrate and the slot substrate which are disposed with the patch electrode side and the slot electrode side opposing each other in such a way that the slots are arranged in correspondence to the patch electrodes.

10. The liquid crystal cell according to claim 9, wherein the liquid crystal layer includes liquid crystal molecules that contain an isothiocyanate group.

* * * * *